United States Patent
Howard

(10) Patent No.: US 10,192,805 B2
(45) Date of Patent: Jan. 29, 2019

(54) THERMALLY CONDUCTIVE AND ELECTRICALLY ISOLATING LAYERS IN SEMICONDUCTOR STRUCTURES

(71) Applicant: Newport Fab, LLC, Newport Beach, CA (US)

(72) Inventor: David J. Howard, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 15/478,496

(22) Filed: Apr. 4, 2017

(65) Prior Publication Data

US 2017/0372983 A1  Dec. 28, 2017

Related U.S. Application Data

(60) Division of application No. 15/194,183, filed on Jun. 27, 2016, now Pat. No. 10,062,636, which is a
(Continued)

(51) Int. Cl.
*H01L 21/30* (2006.01)
*H01L 23/29* (2006.01)
(Continued)

(52) U.S. Cl.
CPC .... *H01L 23/3731* (2013.01); *H01L 21/76251* (2013.01); *H01L 23/291* (2013.01);
(Continued)

(58) Field of Classification Search
CPC ......... H01L 21/76; H01L 21/30; H01L 21/84; H01L 23/36; H01L 23/37
(Continued)

(56) References Cited

U.S. PATENT DOCUMENTS 6,627,953 B1   9/2003  Vu
9,397,038 B1 *  7/2016  Uzoh ................. H01L 23/5223
(Continued)

OTHER PUBLICATIONS

Thermal expansion of AlN, sapphire, and silicon, w. M. Vim and R. J. Paff, RCA Laboratories, Princeton, New Jersey 08540, pp. 1456-1457.

*Primary Examiner* — Sheikh Maruf
(74) *Attorney, Agent, or Firm* — Farjami & Farjami LLP

(57) ABSTRACT

A semiconductor structure includes a semiconductor wafer having at least one semiconductor device integrated in a first device layer, a thermally conductive but electrically isolating layer on a back side of the semiconductor wafer, a front side glass on a front side of the semiconductor wafer, where the thermally conductive but electrically isolating layer is configured to dissipate heat from the at least one semiconductor device integrated in the semiconductor wafer. The thermally conductive but electrically isolating layer is selected from the group consisting of aluminum nitride, beryllium oxide, and aluminum oxide. The at least one semiconductor device is selected from the group consisting of a complementary-metal-oxide-semiconductor (CMOS) switch and a bipolar complementary-metal-oxide-semiconductor (BiCMOS) switch. The semiconductor structure also includes at least one pad opening extending from the back side of the semiconductor wafer to a contact pad.

20 Claims, 12 Drawing Sheets

Related U.S. Application Data continuation-in-part of application No. 15/193,598, filed on Jun. 27, 2016, now Pat. No. 9,966,301.

(51) Int. Cl.

| | | |
|---|---|---|
| *H01L 23/48* | (2006.01) | |
| *H01L 23/373* | (2006.01) | |
| *H01L 23/66* | (2006.01) | |
| *H01L 21/762* | (2006.01) | |
| *H01L 23/522* | (2006.01) | |
| *H01L 23/00* | (2006.01) | |
| *H01L 27/082* | (2006.01) | |
| *H01L 27/12* | (2006.01) | |
| *H01L 27/092* | (2006.01) | |
| *H01L 27/06* | (2006.01) | |
| *H01L 23/367* | (2006.01) | |

(52) U.S. Cl.
CPC ........ *H01L 23/481* (2013.01); *H01L 23/5226* (2013.01); *H01L 23/66* (2013.01); *H01L 24/05* (2013.01); *H01L 27/082* (2013.01); *H01L 27/1203* (2013.01); *H01L 23/367* (2013.01); *H01L 27/0623* (2013.01); *H01L 27/092* (2013.01); *H01L 2223/6616* (2013.01); *H01L 2223/6672* (2013.01); *H01L 2223/6683* (2013.01); *H01L 2224/04042* (2013.01); *H01L 2224/05025* (2013.01); *H01L 2224/05567* (2013.01)

(58) Field of Classification Search
USPC .......................................... 438/458; 257/705
See application file for complete search history.

(56) References Cited

U.S. PATENT DOCUMENTS

| | | | |
|---|---|---|---|
| 9,589,917 B1 | 3/2017 | Rodriguez | |
| 9,865,570 B1* | 1/2018 | England | H01L 25/0657 |
| 2003/0025118 A1 | 2/2003 | Yamazaki | |
| 2004/0085858 A1* | 5/2004 | Khuri-Yakub | B06B 1/0688 |
| | | | 367/181 |
| 2007/0235074 A1* | 10/2007 | Henley | H01L 31/0232 |
| | | | 136/252 |
| 2008/0277778 A1* | 11/2008 | Furman | H01L 21/2007 |
| | | | 257/713 |
| 2008/0290756 A1* | 11/2008 | Huang | B06B 1/0292 |
| | | | 310/300 |
| 2008/0315331 A1* | 12/2008 | Wodnicki | B06B 1/0629 |
| | | | 257/414 |
| 2009/0152705 A1* | 6/2009 | Breng | B81C 1/00333 |
| | | | 257/690 |
| 2010/0219509 A1* | 9/2010 | He | C30B 25/18 |
| | | | 257/618 |
| 2010/0224882 A1 | 9/2010 | Lee | |
| 2010/0327380 A1* | 12/2010 | Chang | B06B 1/0292 |
| | | | 257/419 |
| 2011/0037161 A1* | 2/2011 | Andry | H01L 23/5384 |
| | | | 257/692 |
| 2013/0037922 A1* | 2/2013 | Arriagada | H01L 21/2007 |
| | | | 257/652 |
| 2013/0147061 A1* | 6/2013 | Arriagada | H01L 21/2007 |
| | | | 257/774 |
| 2014/0001626 A1* | 1/2014 | Yamazaki | H01L 27/1214 |
| | | | 257/705 |
| 2014/0061855 A1* | 3/2014 | Kuo | H01L 28/90 |
| | | | 257/532 |
| 2014/0197419 A1* | 7/2014 | Henley | C30B 29/406 |
| | | | 257/76 |
| 2014/0239348 A1* | 8/2014 | Schubert | H01L 29/66462 |
| | | | 257/194 |
| 2014/0346622 A1* | 11/2014 | Stuber | H05K 999/99 |
| | | | 257/416 |
| 2015/0084044 A1 | 3/2015 | Tanaka | |
| 2015/0108502 A1* | 4/2015 | Akiyama | H01L 23/3735 |
| | | | 257/77 |
| 2015/0137238 A1* | 5/2015 | Tsunemi | H01L 27/12 |
| | | | 257/347 |
| 2015/0236102 A1* | 8/2015 | Vielemeyer | H01L 29/2003 |
| | | | 257/76 |
| 2015/0349127 A1* | 12/2015 | Kurata | H01L 27/1225 |
| | | | 257/43 |
| 2016/0013360 A1* | 1/2016 | Coursey | H01L 33/0079 |
| | | | 438/47 |
| 2016/0071958 A1* | 3/2016 | Liu | H01L 21/02381 |
| | | | 257/76 |
| 2016/0276209 A1 | 9/2016 | Usenko | |
| 2016/0308010 A1 | 10/2016 | Viswanathan | |
| 2016/0315047 A1* | 10/2016 | Uzoh | H01L 23/5223 |
| 2016/0336344 A1* | 11/2016 | Mason | H01L 27/1203 |
| 2016/0372628 A1* | 12/2016 | Henley | H01L 33/007 |
| 2017/0110491 A1* | 4/2017 | Hekmatshoartabari | H01L 27/13 |
| 2017/0133295 A1* | 5/2017 | Gu | H01L 23/3732 |
| 2017/0179243 A1* | 6/2017 | Radens | H01L 29/41775 |
| 2017/0200850 A1 | 7/2017 | Lee | |
| 2017/0207142 A1 | 7/2017 | Viswanathan | |
| 2017/0236742 A1* | 8/2017 | Yota | H01L 21/6835 |
| | | | 257/774 |
| 2017/0256558 A1* | 9/2017 | Zhang | H01L 23/5226 |
| 2017/0271261 A1* | 9/2017 | Tsutsumi | H01L 23/5283 |
| 2018/0053704 A1* | 2/2018 | Leipold | H01L 23/293 |

\* cited by examiner

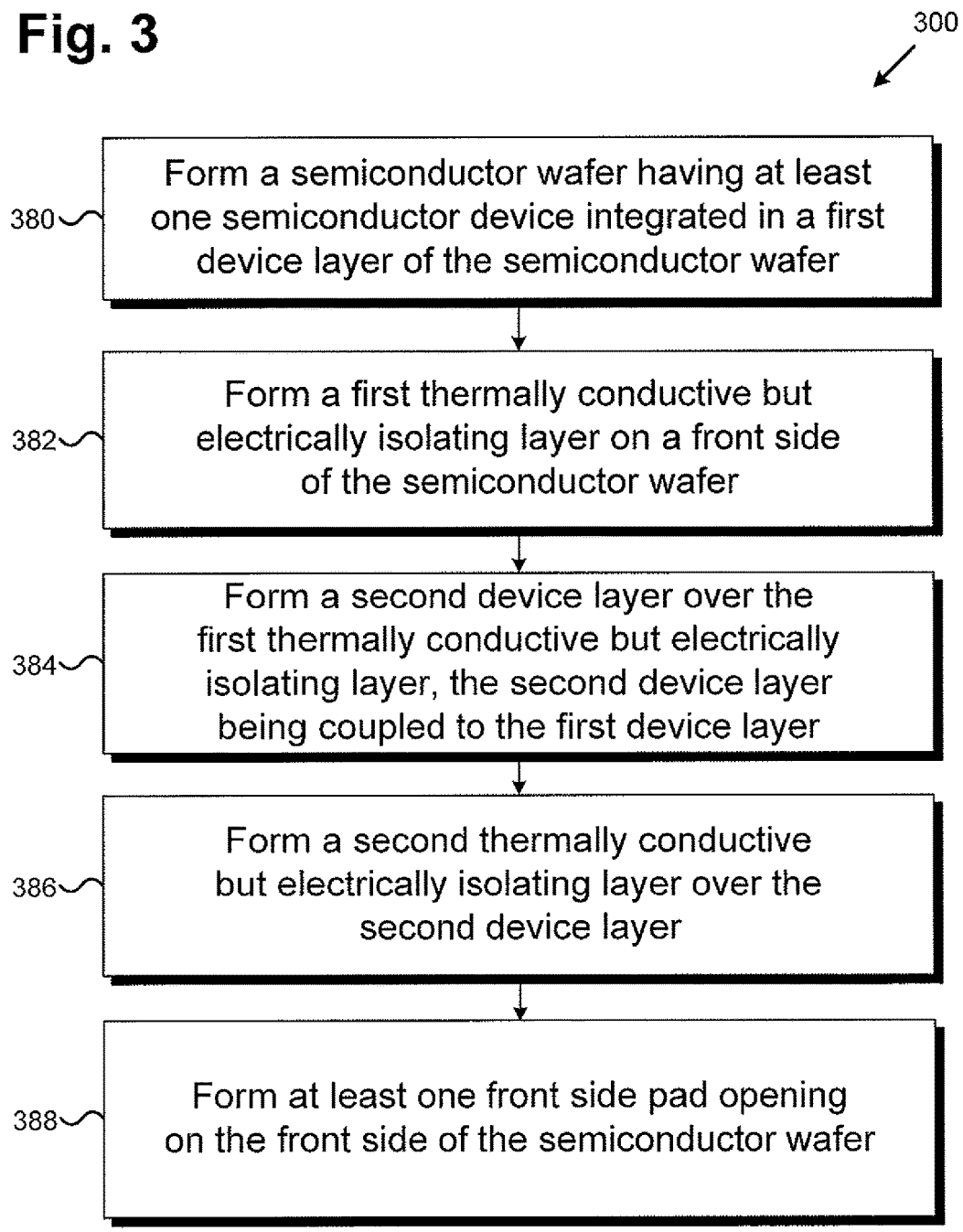

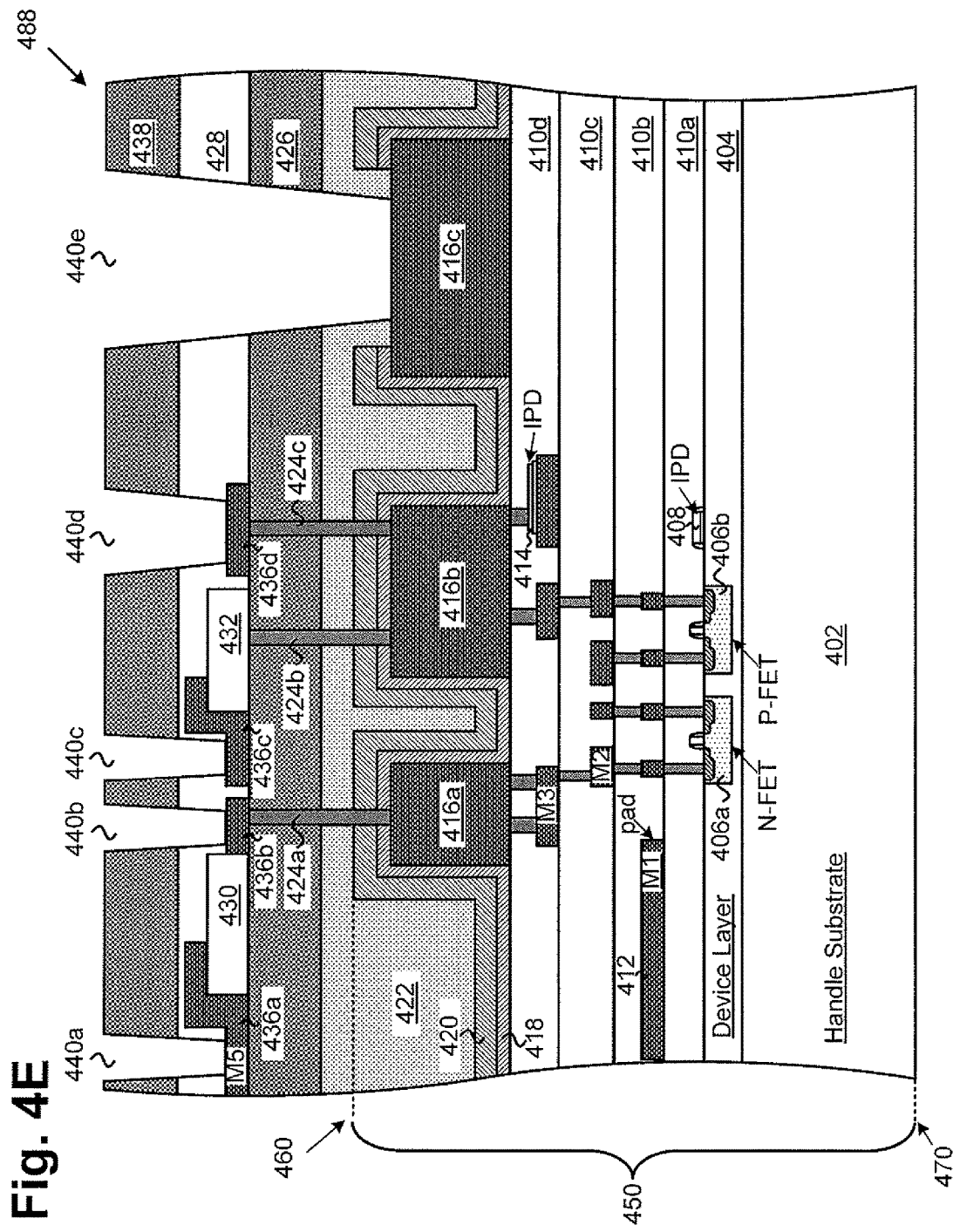

THERMALLY CONDUCTIVE AND ELECTRICALLY ISOLATING LAYERS IN SEMICONDUCTOR STRUCTURES

This is a divisional of application Ser. No. 15/194,183 filed on Jun. 27, 2016, which is a continuation-in-part of and claims priority to U.S. application Ser. No. 15/193,598, filed on Jun. 27, 2016, entitled "Reduced Substrate Effects in Monolithically Integrated RF Circuits." The entire disclosures of the above-identified applications are hereby incorporated fully by reference into the present application.

BACKGROUND

In monolithic radio frequency ("RF") circuits, heat generated by semiconductor devices (e.g., RF switches or power amplifiers) integrated in semiconductor wafers may have deleterious effects on device performance. For example, heat generated by logic devices, such as complementary metal-oxide-semiconductor (CMOS) transistors, integrated in semiconductor wafers can result in degraded linearity and voltage imbalance across large branches of stacked transistors.

In conventional monolithic RF circuits integrated on semiconductor wafers, the spacing between neighboring semiconductor devices is kept at a predetermined minimum distance (e.g., a minimum pitch) to prevent non-linear behavior of the semiconductor devices due to overheating. As a result, the cell density of a semiconductor wafer can be adversely affected by this limitation. In case of a conductive substrate, an increase in the spacing between neighboring semiconductor devices can worsen RF linearity, as most conventional thermal conductors (e.g., metals) are electrical conductors, and can interfere with RF signals.

Thus, there is a need in the art for integration of a thermally conductive but electrically isolating layer with a semiconductor wafer to increase cell density and improve RF linearity.

SUMMARY

The present disclosure is directed to integration of thermally conductive but electrically isolating layers with semiconductor devices, substantially as shown in and/or described in connection with at least one of the figures, and as set forth in the claims.

BRIEF DESCRIPTION OF THE DRAWINGS

FIG. 3 is a flowchart illustrating a method for fabricating an exemplary structure for integration of at least one thermally conductive but electrically isolating layer with a semiconductor wafer according to one implementation of the present application.

FIG. 4E illustrates a cross-sectional view of a portion of an exemplary structure for integration of at least one thermally conductive but electrically isolating layer with a semiconductor wafer processed in accordance with a final action in the flowchart of FIG. 3 according to one implementation of the present application.

DETAILED DESCRIPTION

Figure 1:
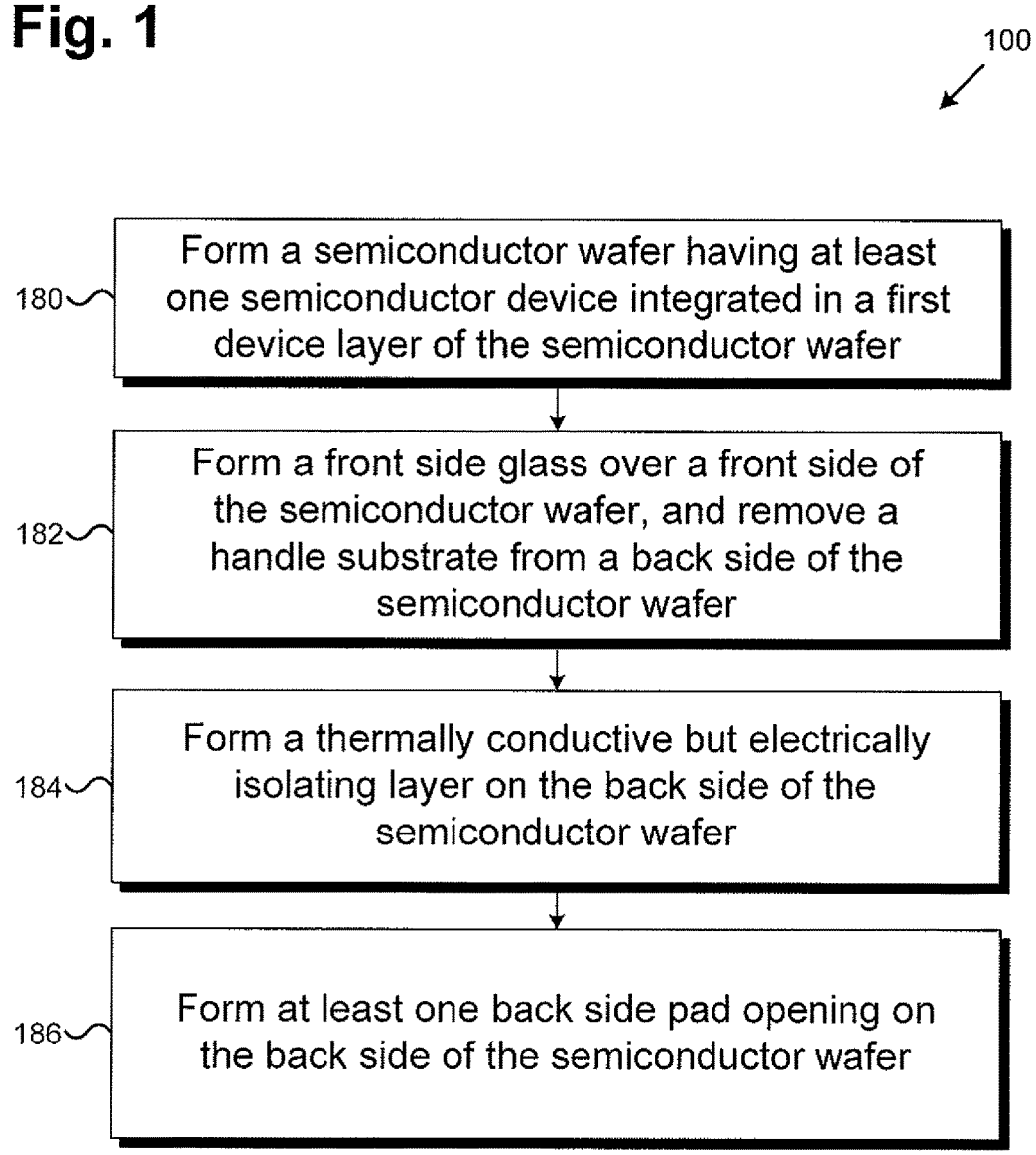
FIG. 1 is a flowchart illustrating a method for fabricating an exemplary structure for integration of a thermally conductive but electrically isolating layer with a semiconductor wafer according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 shows a flowchart illustrating an exemplary method for fabricating an exemplary structure for integration of a thermally conductive but electrically isolating layer with a semiconductor wafer according to one implementation of the present application. Certain details and features have been left out of the flowchart that are apparent to a person of ordinary skill in the art. For example, an action may consist of one or more subactions or may involve specialized equipment or materials, as known in the art. Actions 180, 182, 184 and 186 indicated in flowchart 100 are sufficient to describe one implementation of the present inventive concepts, other implementations of the present inventive concepts may utilize actions different from those shown in flowchart 100. Moreover, structures 280, 282, 284 and 286 in FIGS. 2A, 2B, 2C and 2D illustrate the results of performing actions 180, 182, 184 and 186 of flowchart 100, respectively. For example, structure 280 is a portion of an exemplary structure for integration of a thermally conductive but electrically isolating layer with a semiconductor wafer after processing action 180, structure 282 is a portion of an exemplary structure for integration of a thermally conductive but electrically isolating layer with a semiconductor wafer after the processing of action 182, structure 284 is a portion of an exemplary structure for integration of a thermally conductive but electrically isolating layer with a semiconductor wafer after the processing of action 184, and so forth.

Figure 2A:
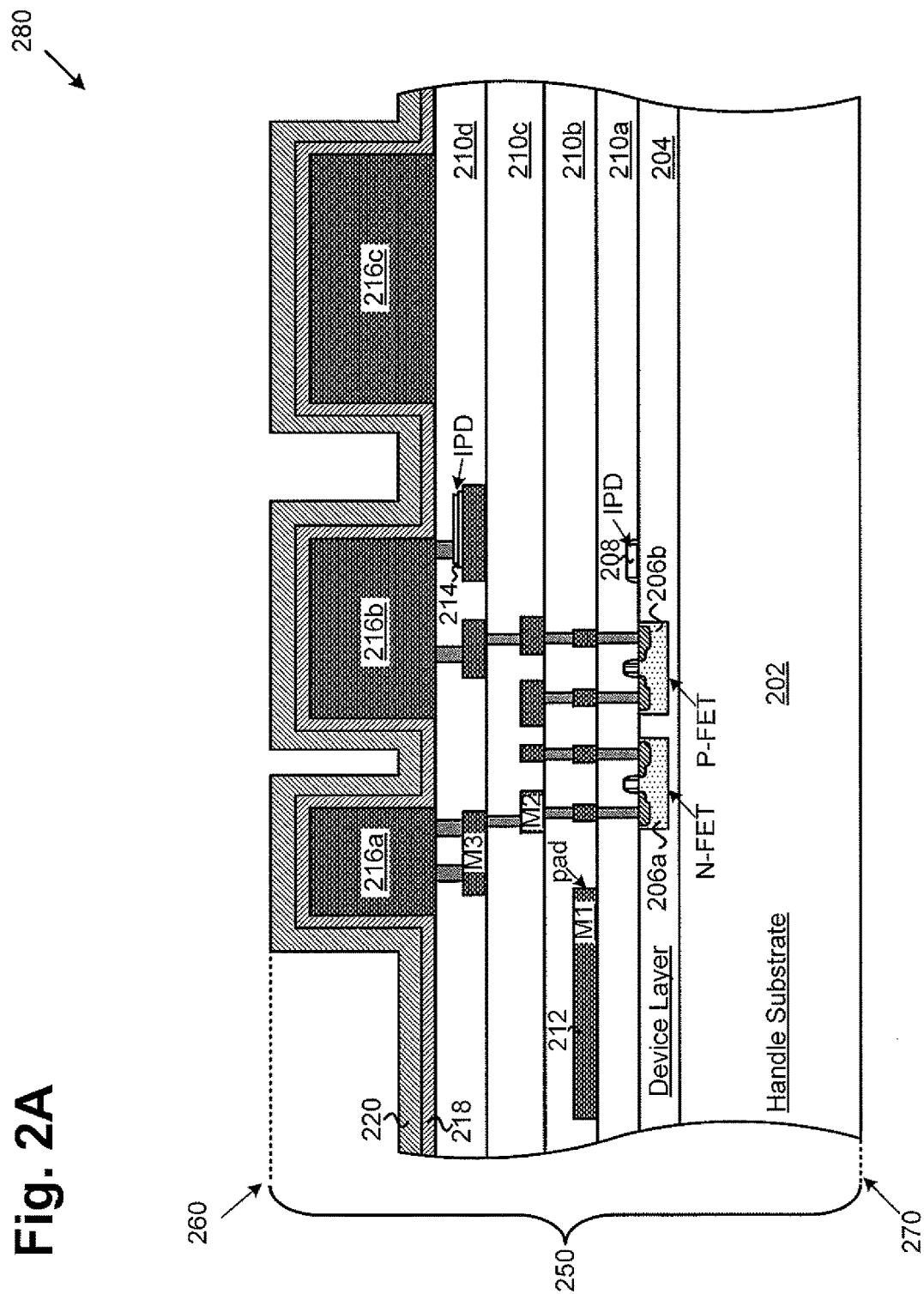
FIG. 2A illustrates a cross-sectional view of a portion of an exemplary structure for integration of a thermally conductive but electrically isolating layer with a semiconductor wafer processed in accordance with an initial action in the flowchart of FIG. 1 according to one implementation of the present application.

Referring to action 180 in FIG. 1 and structure 280 in FIG. 2A, action 180 includes forming a semiconductor wafer having at least one semiconductor device integrated in a first device layer of the semiconductor wafer. Referring to FIG. 2A, structure 280 illustrates a cross-sectional view of a portion of an exemplary structure for integration of a thermally conductive but electrically isolating layer with a semiconductor wafer after the processing of action 180 in flowchart 100 of FIG. 1, according to one implementation of the present application. As illustrated in FIG. 2A, structure 280 includes semiconductor wafer 250 having handle substrate 202, first device layer 204, and dielectric layers 210a, 210b, 210c and 210d. Semiconductor wafer 250 also includes various patterned interconnect metal layers and conductive vias in dielectric layers 210a, 210b, 210c and 210, and contact pads 216a, 216b and 216c for external connections. In the present implementation, semiconductor wafer 250 is a radio frequency (RF) complementary metal-oxide-semiconductor (CMOS) wafer. In other implementations, semiconductor wafer 250 may be any suitable semiconductor wafer.

As illustrated in FIG. 2A, handle substrate 202 is on back side 270 of semiconductor wafer 250. Handle substrate 202 can include any suitable material, such as silicon or other materials, that can support active and/or passive devices thereon. In one implementation, handle substrate 202 may be a semiconductor substrate, having silicon, silicon-on-insulator (SOI), silicon-on-sapphire (SOS), silicon germanium, an epitaxial layer of silicon formed on a silicon substrate, or the like. In another implementation, handle substrate 202 may include glass, silicon carbide (SiC), aluminum carbide, polymer, or the like. In yet another implementation, handle substrate 202 may be a high resistivity substrate.

As illustrated in FIG. 2A, first device layer 204 is on handle substrate 202. In the present implementation, first device layer 204 may include active circuits that can comprise any form of circuitry that switches from one state to another to perform logic functions (e.g., transistors) such as radio frequency (RF) circuits, power amplifier circuits, voltage control oscillator circuits, ring oscillator circuits, low noise amplifier circuits, mixer circuits, digital-to-analog converter circuits, and analog-to-digital converters circuits. As illustrated in FIG. 2A, first device layer 204 includes N-channel field-effect transistor (NFET) 206a and P-channel field-effect transistor (PFET) 206b integrated therein. NFET 206a may be formed in a CMOS P well, and include source and drain regions and a gate structure formed over a channel region of NFET 206a. PFET 206b may be formed in a CMOS N well, and include source and drain regions and a gate structure formed over a channel region of PFET 206b. It should be noted that, although only NFET 206a and PFET 206b are shown in FIG. 2A, there can be other active devices, such as bipolar complementary-metal-oxide-semiconductor (BiCMOS) devices and/or power amplifiers, integrated in first device layer 204. As illustrated in FIG. 2A, integrated passive device 208 is formed on first device layer 204. Integrated passive device 208 may include a resistor, a capacitor, an inductor, a coupler, a transformer, an antenna, a microelectromechanical systems (MEMS) device, or a phase change device (e.g., a phase change memory device or a phase change RF device, such as a switch). It should be noted that, although only integrated passive device 208 is shown in FIG. 2A, there can be other integrated passive devices on first device layer 204.

As illustrated in FIG. 2A, dielectric layers 210a, 210b, 210c and 210d are formed over first device layer 204. Dielectric layers 210a, 210b, 210c and 210d may include any suitable dielectric material, such as silicon dioxide. Interconnect metal layers M1, M2 and M3 are formed and patterned on dielectric layers 210a, 210b and 210c, respectively. As illustrated in FIG. 2A, patterned interconnect metal layers along with conductive vias are configured to provide electrical connections to one or more devices, such as NFET 206a and PFET 206b. In addition, contact pad 212 as a part of patterned interconnect metal layer M1 is formed on dielectric layer 210a, and configured to provide electrical connection for one or more devices integrated in semiconductor wafer 250. As illustrated in FIG. 2A, NFET 206a is electrically coupled to contact pad 216a situated over dielectric layer 210d through corresponding patterned interconnect metal layers M1, M2 and M3, and conductive vias. Similarly, PFET 206b is electrically coupled to contact pad 216b situated over dielectric layer 210d through corresponding patterned interconnect metal layers M1, M2 and M3, and conductive vias. Also, integrated passive device 214 is formed on dielectric layer 210c and coupled to contact pad 216b through one or more conductive vias, for example. Integrated passive device 214 may include a passive device such as a resistor, a capacitor, an inductor, a coupler, a transformer, an antenna, a microelectromechanical systems (MEMS) device, or a phase change device (e.g., a phase change memory device or a phase change RF device, such as a switch). Contact pad 216c is situated over dielectric layer 210d, and electrically coupled to one or more semiconductor devices (not explicitly shown in FIG. 2A) integrated in semiconductor wafer 250. Patterned interconnect metal layers M1, M2 and M3, conductive vias, and contact pads 216a, 216b and 216c may each include any suitable conductive material, such as a metal or a metal alloy. As illustrated in FIG. 2A, front side 260 of semiconductor wafer 250 is covered with passivation layers 218 and 220. In one implementation, passivation layers 218 and 220 may include an oxide-based material and a nitride-based material, respectively.

Figure 2B:
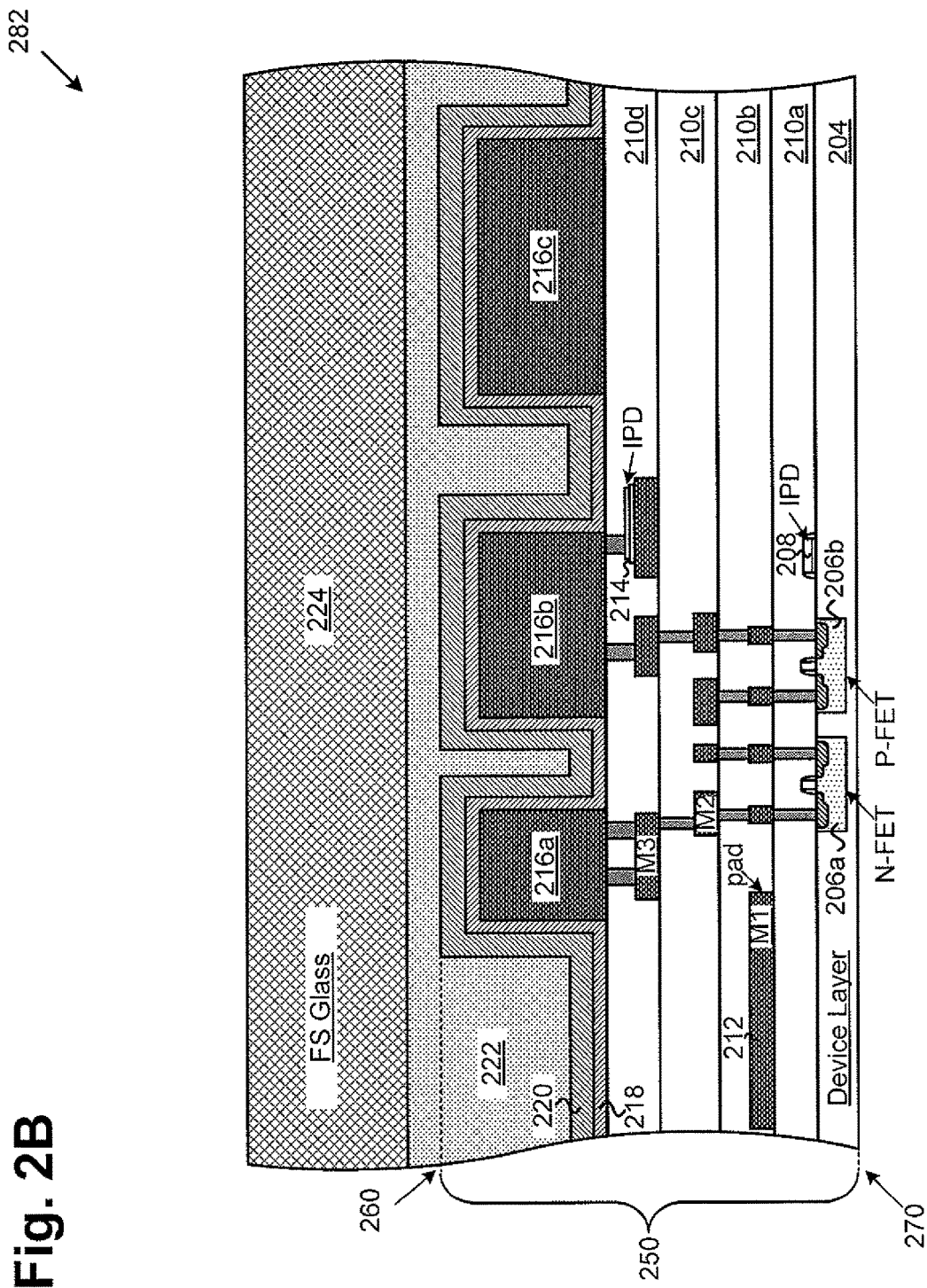
FIG. 2B illustrates a cross-sectional view of a portion of an exemplary structure for integration of a thermally conductive but electrically isolating layer with a semiconductor wafer processed in accordance with an intermediate action in the flowchart of FIG. 1 according to one implementation of the present application.

Referring to action 182 in FIG. 1 and structure 282 in FIG. 2B, action 182 includes forming a front side glass over a front side of the semiconductor wafer, and removing a handle substrate from a back side of the semiconductor wafer. Referring to FIG. 2B, structure 282 illustrates a cross-sectional view of a portion of an exemplary structure for integration of a thermally conductive but electrically isolating layer with a semiconductor wafer after the processing of action 182 in flowchart 100 of FIG. 1, according to one implementation of the present application. As illustrated in FIG. 2B, structure 282 includes front side glass 224 over front side 260 of semiconductor wafer 250. Also, handle substrate 202 as shown in FIG. 2A is removed from back side 270 of semiconductor wafer 250.

As illustrated in FIG. 2B, front side glass 224 is situated over front side 260 of semiconductor wafer 250. Oxide layer 222 is deposited and optionally planarized over front side 260 of semiconductor wafer 250 before front side glass 224 is formed thereon. Front side glass 224 may be coupled to front side 260 of semiconductor wafer 250 by, for example, fusion bonding or attachment through a polymer or a polymer composite. In one implementation, front side glass 224 may include any suitable semiconductor glass, such as commercially available Corning® Semiconductor Glass Wafers. In another implementation, front side glass 224 may include a material other than glass, such as polymer, SiC, sapphire, quartz, and etc.

As illustrated in FIG. 2B, handle substrate 202 shown in FIG. 2A is removed from back side 270 of semiconductor wafer 250, by etching and/or grinding handle substrate 202 from back side 270, for example. After removing handle substrate 202, first device layer 204 is exposed from back side 270 of semiconductor wafer 250. By removing handle substrate 202, parasitic charges, which would otherwise be present in handle substrate 202 and would in turn lead to a parasitic conduction layer, are effectively eliminated. For example, parasitic charge accumulation in handle substrate 202, for example, at an interface between a silicon substrate and an overlying isolating layer, can be effectively eliminated. Consequently, a parasitic coupling between a parasitic conduction layer (PCL) and overlying conductors can also be eliminated, thereby significantly reducing power loss and improving linearity (e.g., substantially eliminating second and third harmonics) of the RF signals in semiconductor wafer 250.

Figure 2C:
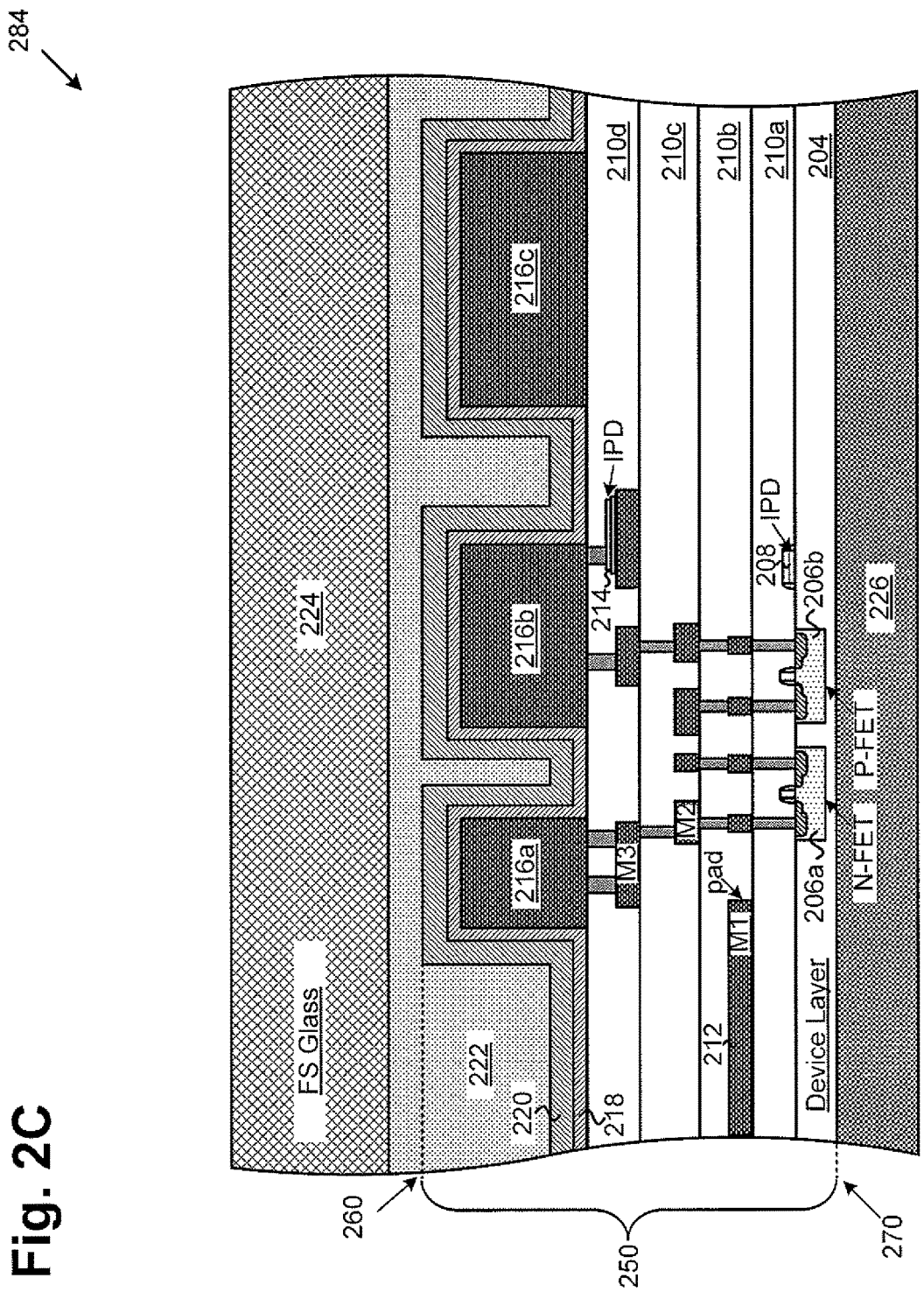
FIG. 2C illustrates a cross-sectional view of a portion of an exemplary structure for integration of a thermally conductive but electrically isolating layer with a semiconductor wafer processed in accordance with an intermediate action in the flowchart of FIG. 1 according to one implementation of the present application.

Referring to action 184 in FIG. 1 and structure 284 in FIG. 2C, action 184 includes forming a thermally conductive but electrically isolating layer on the back side of the semiconductor wafer. Referring to FIG. 2C, structure 284 illustrates a cross-sectional view of a portion of an exemplary structure for integration of a thermally conductive but electrically isolating layer with a semiconductor wafer after the processing of action 184 in flowchart 100 of FIG. 1, according to one implementation of the present application. As illustrated in FIG. 2C, structure 284 includes thermally conductive but electrically isolating layer 226 on back side 270 of semiconductor wafer 250.

In the present implementation, thermally conductive but electrically isolating layer 226 includes a material with a high thermal conductivity (e.g., at least 36 W/mK) and a high resistivity (e.g., at least $10^{14}$ ohm-cm). In addition, thermally conductive but electrically isolating layer 226 has a coefficient of thermal expansion (CTE) that is closely matched (e.g., within the same order of magnitude) with first device layer 204 to reduce mechanical and thermal stresses. In the present implementation, thermally conductive but electrically isolating layer 226 includes aluminum nitride (AlN). For example, aluminum nitride has a high thermal conductivity in a range approximately between 170-200 W/mK, a high resistivity of at least $10^{14}$ ohm-cm, and a CTE of approximately 4.6 ppm/C which is closely matched with the CTE of first device layer 204 (e.g., silicon around 2.3-3.6 ppm/C). In another implementation, thermally conductive but electrically isolating layer 226 may include beryllium oxide having a high thermal conductivity of approximately 260 W/mK, a high resistivity of at least $10^{14}$ ohm-cm, and a CTE of approximately 8.5 ppm/C which is closely matched with the CTE of first device layer 204. In yet another implementation, thermally conductive but electrically isolating layer 226 may include aluminum oxide having a high thermal conductivity of approximately 36 W/mK, a high resistivity of at least $10^{14}$ ohm-cm, and a CTE of approximately 8.2 ppm/C which is closely matched with the CTE of first device layer 204.

In one implementation, action 184 may be accomplished using any appropriate deposition technique, such as chemical vapor deposition (CVD), physical vapor deposition (PVD) or atomic layer deposition (ALD) for example. In one implementation, thermally conductive but electrically isolating layer 226 may have a thickness in a range approximately between 0.5-2 microns (i.e., $10^{-6}$ meters). In one implementation, thermally conductive but electrically isolating layer 226 is formed preferably at low temperate (e.g., less than 450° C.) to prevent damage to semiconductor devices and interconnect metal layers in semiconductor wafer 250. It should be noted that the thermal conductivity, the resistivity, the CTE and the thickness of thermally conductive but electrically isolating layer 226 are not limited by the specified values or ranges mentioned above.

In the present implementation, since thermally conductive but electrically isolating layer 226 has a high thermal conductivity, it is configured to dissipate heat from semiconductor devices integrated in semiconductor wafer 250. For example, thermally conductive but electrically isolating layer 226 is thermally coupled to semiconductor devices, such as NFET 206a and NFET 206b, integrated in first device layer 204. Thermally conductive but electrically isolating layer 226 is configured to draw heat generated by away from semiconductor wafer 250 not only in a direction perpendicular to back side 270 of semiconductor wafer 250, but more importantly in directions parallel to back side 270 of semiconductor wafer 250. Since heat generated by semiconductor devices, such as NFET 206a and PFET 206b, can be effectively drawn out of semiconductor wafer 250 through thermally conductive but electrically isolating layer 226, the semiconductor devices integrated in first device layer 204 can be fabricated much closer to one another, at cell pitches less than the conventionally predetermined minimum cell pitch for preventing overheating. Thus, semiconductor wafer 250 can have an increased cell density, which can in turn lead to better device performance characteristics, such as a higher current carrying capability and lower $R_{DSON}$. Moreover, by replacing handle substrate 202 with thermally conductive but electrically isolating layer 226 on back side 270 of semiconductor wafer 250, the present implementation can effectively eliminate parasitic effects, such as parasitic capacitance between a parasitic conduction layer (PCL) in handle substrate 202 and overlying conductors in semiconductor wafer 250. Thus, among other advantages, the present implementation can reduce power loss and improve linearity (e.g., substantially eliminating second and third harmonics) of the RF signals in semiconductor wafer 250.

Figure 2D:
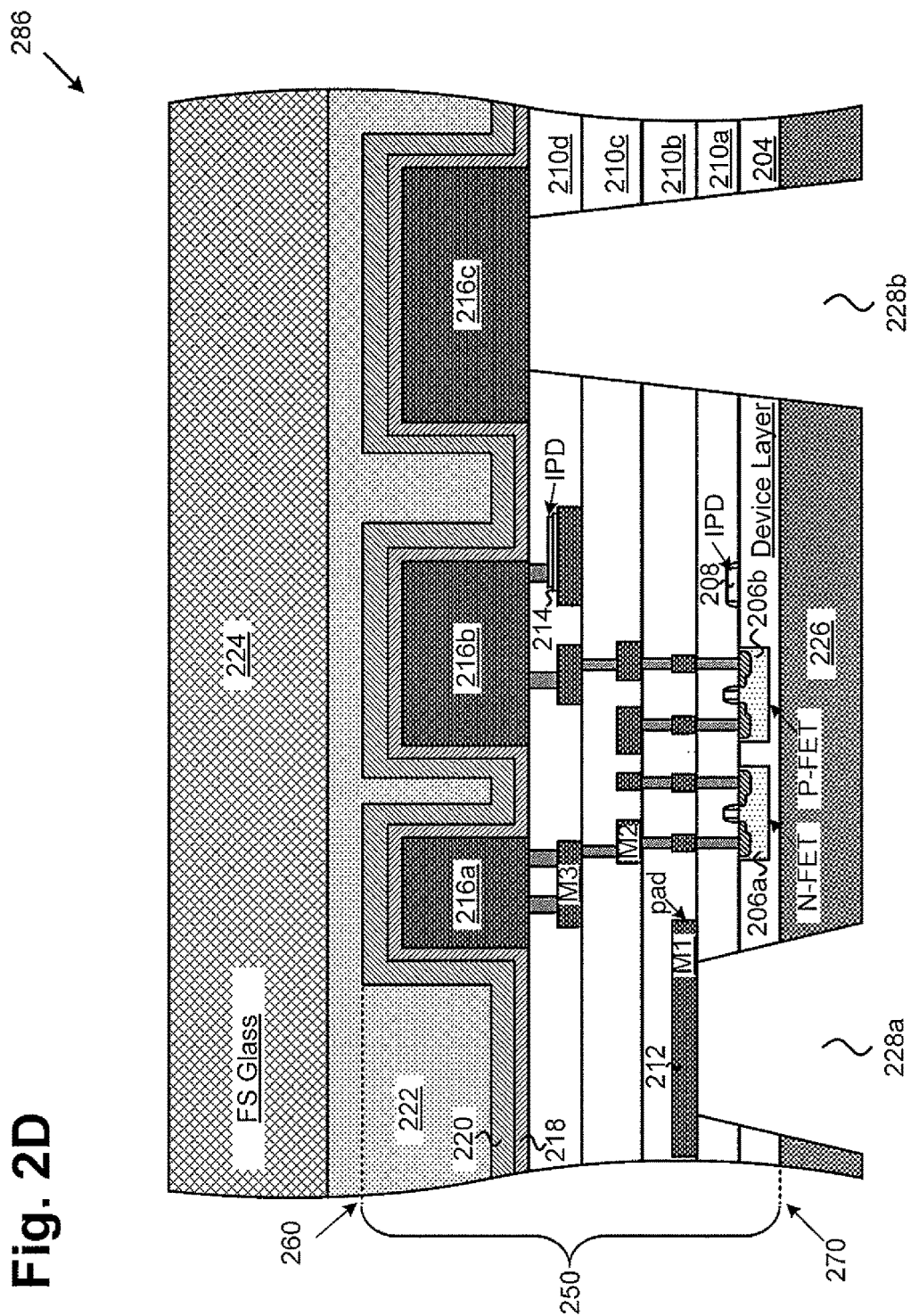
FIG. 2D illustrates a cross-sectional view of a portion of an exemplary structure for integration of a thermally conductive but electrically isolating layer with a semiconductor wafer processed in accordance with a final action in the flowchart of FIG. 1 according to one implementation of the present application.

Referring to action 186 in FIG. 1 and structure 286 in FIG. 2D, action 186 includes forming at least one back side pad opening on the back side of the semiconductor wafer. Referring to FIG. 2D, structure 286 illustrates a cross-sectional view of a portion of an exemplary structure for integration of a thermally conductive but electrically isolating layer with a semiconductor wafer after the processing of action 186 in flowchart 100 of FIG. 1, according to one implementation of the present application. As illustrated in FIG. 2D, structure 286 includes back side pad openings 228a and 228b on back side 270 of semiconductor wafer 250.

As illustrated in FIG. 2D, back side pad opening 228a extends through thermally conductive but electrically isolating layer 226, first device layer 204 and dielectric layer 210a from back side 270 of semiconductor wafer 250, and reaches contact pad 212. Back side pad opening 228a allows external connection to contact pad 212. Back side pad opening 228b extends through thermally conductive but electrically isolating layer 226, first device layer 204 and dielectric layers 210a, 210b, 210c and 210d from back side 270 of semiconductor wafer 250, and reaches contact pad 216c. Back side pad opening 228b allows external connection to contact pad 216c. Back side pad openings 228a and 228b may be formed by any suitable method, such as a patterned etch. It should be understood that, although only two back side pad openings are shown in FIG. 2D, other back side pad openings (not explicitly shown in FIG. 2D) can be formed on back side 270 of semiconductor wafer 250 to reach other contact pads (not explicitly shown in FIG. 2D) in semiconductor wafer 250.

In one implementation, semiconductor structure 286 can be flip-chip mounted, with back side 270 of semiconductor wafer 250 facing down, to a printed circuit board (not explicitly shown in FIG. 2D) through conductive adhesives. In another implementation, front side glass 224 of semiconductor structure 286 can be attached to a printed circuit board (not explicitly shown in FIG. 2D), where contact pads 212 and 216c can make electrical connections with the printed circuit board through wire bonds.

Referring to FIG. 3, FIG. 3 shows a flowchart illustrating an exemplary method for fabricating an exemplary structure for integration of at least one thermally conductive but electrically isolating layer with a semiconductor wafer according to one implementation of the present application. Certain details and features have been left out of the flowchart that are apparent to a person of ordinary skill in the art. For example, an action may consist of one or more subactions or may involve specialized equipment or materials, as known in the art. Actions 380, 382, 384, 386 and 388 indicated in flowchart 300 are sufficient to describe one implementation of the present inventive concepts, other implementations of the present inventive concepts may utilize actions different from those shown in flowchart 300. Moreover, structures 480, 482, 484, 486 and 488 in FIGS. 4A, 4B, 4C, 4D and 4E illustrate the results of performing actions 380, 382, 384, 386 and 388 of flowchart 300, respectively. For example, structure 480 is a portion of an exemplary structure for integration of at least one thermally conductive but electrically isolating layer with a semiconductor wafer after processing action 380, structure 482 is a portion of an exemplary structure for integration of at least one thermally conductive but electrically isolating layer with a semiconductor wafer after the processing of action 382, structure 484 is a portion of an exemplary structure for integration of at least one thermally conductive but electrically isolating layer with a semiconductor wafer after the processing of action 384, and so forth.

Figure 4A:
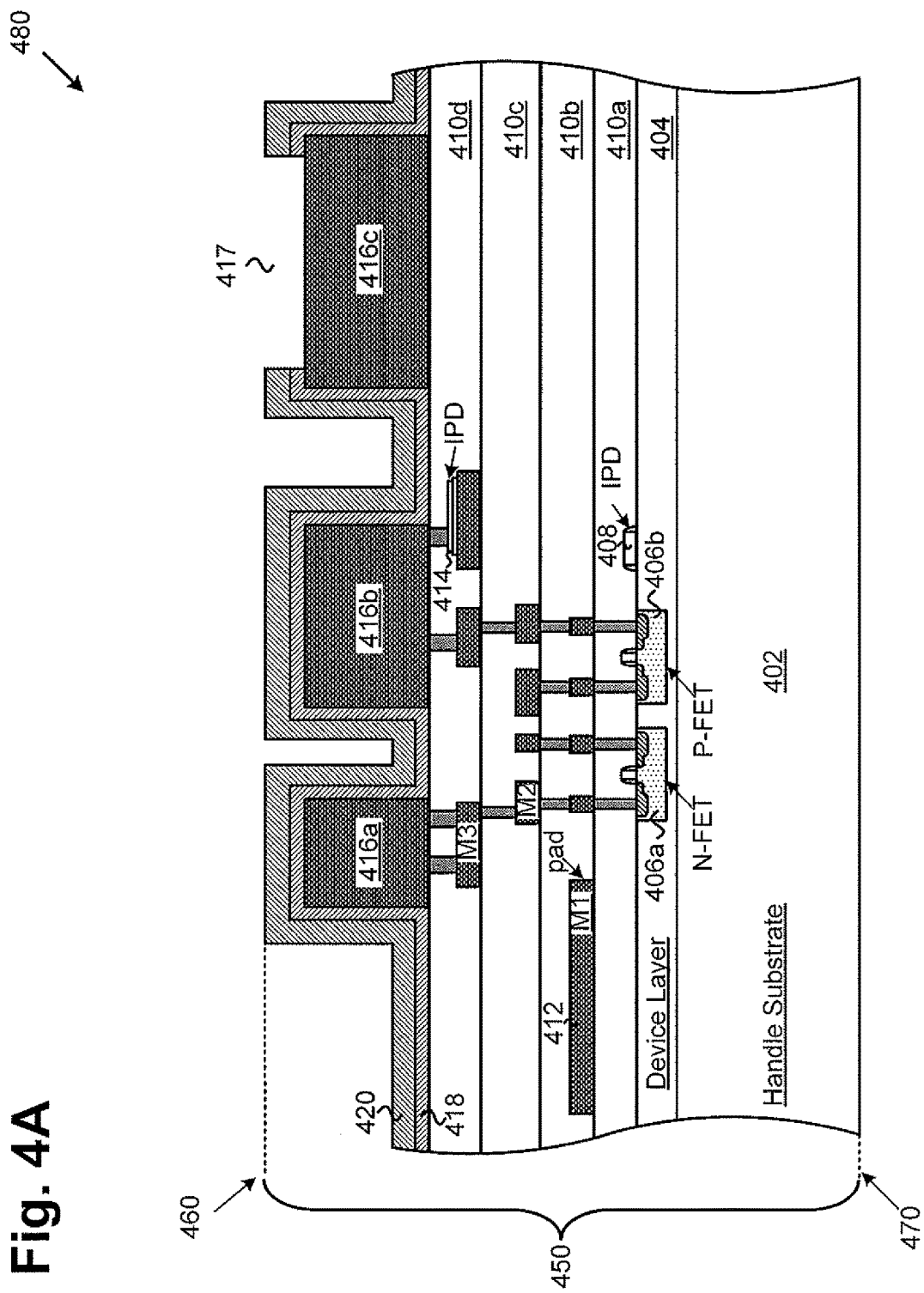
FIG. 4A illustrates a cross-sectional view of a portion of an exemplary structure for integration of at least one thermally conductive but electrically isolating layer with a semiconductor wafer processed in accordance with an initial action in the flowchart of FIG. 3 according to one implementation of the present application.

Referring to action 380 in FIG. 3 and structure 480 in FIG. 4A, action 380 includes forming a semiconductor wafer having at least one semiconductor device integrated in a first device layer of the semiconductor wafer. Referring to FIG. 4A, structure 480 illustrates a cross-sectional view of a portion of an exemplary structure for integration of at least one thermally conductive but electrically isolating layer with a semiconductor wafer after the processing of action 380 in flowchart 300 of FIG. 3, according to one implementation of the present application. As illustrated in FIG. 4A, structure 480 includes semiconductor wafer 450 having handle substrate 402, first device layer 404, and dielectric layers 410a, 410b, 410c and 410d. Semiconductor wafer 450 also includes various patterned interconnect metal layers and conductive vias in dielectric layers 410a, 410b, 410c and 410d, and contact pads 416a, 416b and 416c for external connections. In the present implementation, semiconductor wafer 450 is a radio frequency (RF) complementary metal-oxide-semiconductor (CMOS) wafer. In other implementations, semiconductor wafer 450 may be any suitable semiconductor wafer.

As illustrated in FIG. 4A, handle substrate 402 is on back side 470 of semiconductor wafer 450. Handle substrate 402 can include any suitable material, such as silicon or other materials, that can support active and/or passive devices thereon. In one implementation, handle substrate 402 may be a semiconductor substrate, having silicon, silicon-on-insulator (SOI), silicon-on-sapphire (SOS), silicon germanium, an epitaxial layer of silicon formed on a silicon substrate, or the like. In another implementation, handle substrate 402 may include glass, silicon carbide (SiC), aluminum carbide, polymer, or the like. In yet another implementation, handle substrate 402 may be a high resistivity substrate.

As illustrated in FIG. 4A, first device layer 404 is on handle substrate 402. First device layer 404 can include any suitable semiconductor material having silicon, silicon germanium or the like. In the present implementation, first device layer 404 may include active circuits that can comprise any form of circuitry that switches from one state to another to perform logic functions (e.g., transistors) such as radio frequency (RF) circuits, power amplifier circuits, voltage control oscillator circuits, ring oscillator circuits, low noise amplifier circuits, mixer circuits, digital-to-analog converter circuits, and analog-to-digital converters circuits. As illustrated in FIG. 4A, first device layer 404 includes N-channel field-effect transistor (NFET) 406a and P-channel field-effect transistor (PFET) 406b integrated therein. NFET 406a may be formed in a CMOS P well, and include source and drain regions and a gate structure formed over a channel region of NFET 406a. PFET 406b may be formed in a CMOS N well, and include source and drain regions and a gate structure formed over a channel region of PFET 406b. It should be noted that, although only NFET 406a and PFET 406b are shown in FIG. 4A, there can be other active devices, such as BiCMOS devices and/or power amplifiers, integrated in first device layer 404. As illustrated in FIG. 4A, integrated passive device 408 is formed on first device layer 404. Integrated passive device 408 may include a resistor, a capacitor, an inductor, a coupler, a transformer, an antenna, a microelectromechanical systems (MEMS) device, or a phase change device (e.g., a phase change memory device or a phase change RF device, such as a switch). It should be noted that, although only integrated passive device 408 is shown in FIG. 4A, there can be other integrated passive devices on first device layer 404.

As illustrated in FIG. 4A, dielectric layers 410a, 410b, 410c and 410d are formed over first device layer 404. Dielectric layers 410a, 410, 410c and 410d may include any suitable dielectric material, such as silicon dioxide. Interconnect metal layers M1, M2 and M3 are formed and patterned on dielectric layers 410*a*, 410*b* and 410*c*, respectively. As illustrated in FIG. 4A, patterned interconnect metal layers along with conductive vias are configured to provide electrical connections to one or more devices, such as NFET 406*a* and PFET 406*b*. In addition, contact pad 412 as a part of patterned interconnect metal layer M1 is formed on dielectric layer 410*a*, and configured to provide electrical connection for one or more devices integrated in semiconductor wafer 450.

As illustrated in FIG. 4A, NFET 406*a* is electrically coupled to contact pad 416*a* situated over dielectric layer 410*d* through corresponding patterned interconnect metal layers M1, M2 and M3, and conductive vias. Similarly, PFET 406*b* is electrically coupled to contact pad 416*b* situated over dielectric layer 410*d* through corresponding patterned interconnect metal layers M1, M2 and M3, and conductive vias. Also, integrated passive device 414 is formed on dielectric layer 410*c* and coupled to contact pad 416*b* through one or more conductive vias, for example. Integrated passive device 414 may include a passive device such as a resistor, a capacitor, an inductor, a coupler, a transformer, an antenna, a microelectromechanical systems (MEMS) device, or a phase change device (e.g., a phase change memory device or a phase change RF device, such as a switch). Contact pad 416*c* is situated over dielectric layer 410*d*, and electrically coupled to one or more semiconductor devices (not explicitly shown in FIG. 4A) integrated in semiconductor wafer 450. Patterned interconnect metal layers M1, M2 and M3, conductive vias, and contact pads 416*a*, 416*b* and 416*c* may each include any suitable conductive material, such as a metal or a metal alloy. As illustrated in FIG. 4A, front side 460 of semiconductor wafer 450 is covered with passivation layers 418 and 420. In one implementation, passivation layers 418 and 420 may include an oxide-based material and a nitride-based material, respectively. Patterned opening 417 is formed on front side 460 of semiconductor wafer 450, and extends through passivation layers 418 and 420 to reach contact pad 416*c*.

Figure 4B:
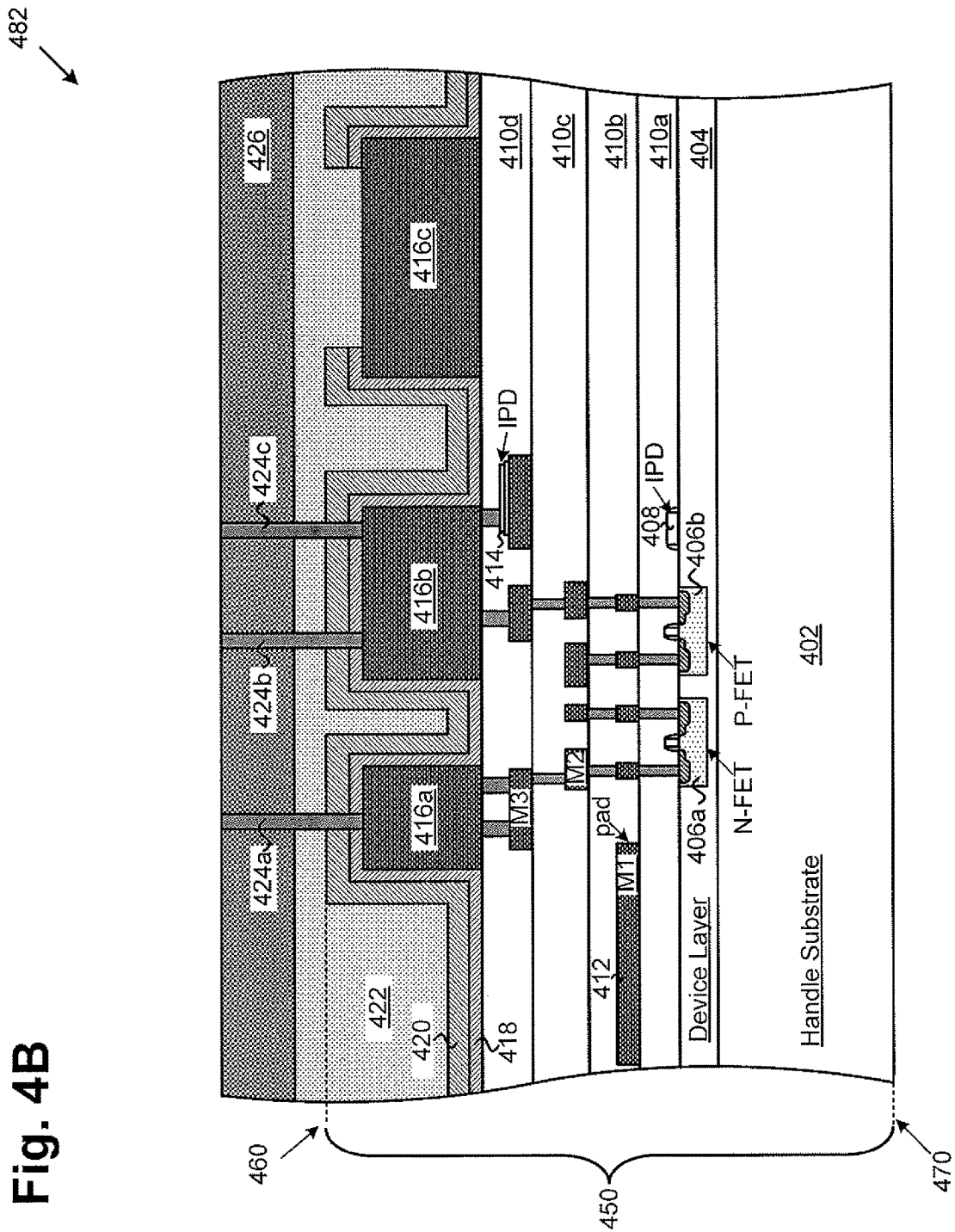
FIG. 4B illustrates a cross-sectional view of a portion of an exemplary structure for integration of at least one thermally conductive but electrically isolating layer with a semiconductor wafer processed in accordance with an intermediate action in the flowchart of FIG. 3 according to one implementation of the present application.

Referring to action 382 in FIG. 3 and structure 482 in FIG. 4B, action 382 includes forming a first thermally conductive but electrically isolating layer on a front side of the semiconductor wafer. Referring to FIG. 4B, structure 482 illustrates a cross-sectional view of a portion of an exemplary structure for integration of at least one thermally conductive but electrically isolating layer with a semiconductor wafer after the processing of action 382 in flowchart 300 of FIG. 3, according to one implementation of the present application. As illustrated in FIG. 4B, structure 482 includes first thermally conductive but electrically isolating layer 426 on front side 460 of semiconductor wafer 450.

As illustrated in FIG. 4B, first thermally conductive but electrically isolating layer 426 is situated on front side 460 of semiconductor wafer 450. Oxide layer 422 is deposited and optionally planarized over front side 460 of semiconductor wafer 450 before first thermally conductive but electrically isolating layer 426 is formed thereon. In the present implementation, first thermally conductive but electrically isolating layer 426 includes a material with a high thermal conductivity (e.g., at least 36 W/mK) and a high resistivity (e.g., at least 10^14 ohm-cm). In addition, first thermally conductive but electrically isolating layer 426 has a coefficient of thermal expansion (CTE) that is closely matched (e.g., within the same order of magnitude) with the effective CTE of semiconductor wafer 450 to reduce mechanical and thermal stresses. In the present implementation, first thermally conductive but electrically isolating layer 426 includes aluminum nitride (AlN). For example, aluminum nitride has a high thermal conductivity in a range approximately between 170-200 W/mK, a high resistivity of at least 10^14 ohm-cm, and a CTE of approximately 4.6 ppm/C which is closely matched with the effective CTE of semiconductor wafer 450 (e.g., silicon around 2.3-3.6 ppm/C). In another implementation, first thermally conductive but electrically isolating layer 426 may include beryllium oxide having a high thermal conductivity of approximately 260 W/mK, a high resistivity of at least 10^14 ohm-cm, and a CTE of approximately 8.5 ppm/C which is closely matched with the effective CTE of semiconductor wafer 450. In yet another implementation, first thermally conductive but electrically isolating layer 426 may include aluminum oxide having a high thermal conductivity of approximately 36 W/mK, a high resistivity of at least 10^14 ohm-cm, and a CTE of approximately 8.2 ppm/C which is closely matched with the effective CTE of semiconductor wafer 450.

In one implementation, action 382 may be accomplished using any appropriate deposition technique, such as chemical vapor deposition (CVD), physical vapor deposition (PVD) or atomic layer deposition (ALD) for example. In one implementation, first thermally conductive but electrically isolating layer 426 may have a thickness in a range approximately between 0.5-2 microns (i.e., 10^−6 meters). In one implementation, first thermally conductive but electrically isolating layer 426 is formed preferably at low temperate (e.g., less than 450° C.) to prevent damage to semiconductor devices and interconnect metal layers in semiconductor wafer 450. It should be noted that the thermal conductivity, the resistivity, the CTE and the thickness of first thermally conductive but electrically isolating layer 426 are not limited by the specified values or ranges mentioned above.

In the present implementation, since first thermally conductive but electrically isolating layer 426 has a high thermal conductivity, it is configured to dissipate heat from semiconductor devices integrated in first device layer 404 of semiconductor wafer 450. For example, first thermally conductive but electrically isolating layer 426 is thermally coupled to semiconductor devices, such as NFET 406*a* and NFET 406*b*, integrated in first device layer 404. First thermally conductive but electrically isolating layer 426 is configured to draw heat away from semiconductor wafer 450 not only in a direction perpendicular to front side 460 of semiconductor wafer 450, but more importantly in directions parallel to front side 460 of semiconductor wafer 450. Since heat generated by semiconductor devices, such as NFET 406*a* and PFET 406*b*, can be effectively drawn out of semiconductor wafer 450 through first thermally conductive but electrically isolating layer 426 along with various patterned interconnect metal layers and conductive vias, the semiconductor devices integrated in first device layer 404 can be fabricated much closer to one another, at cell pitches less than the conventionally predetermined minimum cell pitch for preventing overheating. Thus, semiconductor wafer 450 can have an increased cell density, which can in turn lead to better device performance characteristics, such as a higher current carrying capability and lower $R_{DSON}$.

As illustrated in FIG. 4B, conductive vias 424*a*, 424*b* and 424*c* are formed on front side 460 of semiconductor wafer 450. For example, conductive via 424*a* extends through first thermally conductive but electrically isolating layer 426, oxide layer 422, and passivation layers 420 and 418, and reaches contact pad 416*a*, which is electrically and thermally coupled to NFET 406*a* in first device layer 404. Conductive vias 424*b* and 424*c* extend through first thermally conductive but electrically isolating layer 426, oxide layer 422, and passivation layers 420 and 418, and reach contact pad 416*b*, which is electrically and thermally coupled to PFET 406*b* in first device layer 404. Conductive vias 424*a*, 424*b* and 424*c* may be formed by any suitable method, and may include any suitable conductive material, such as a metal or a metal alloy.

Figure 4C:
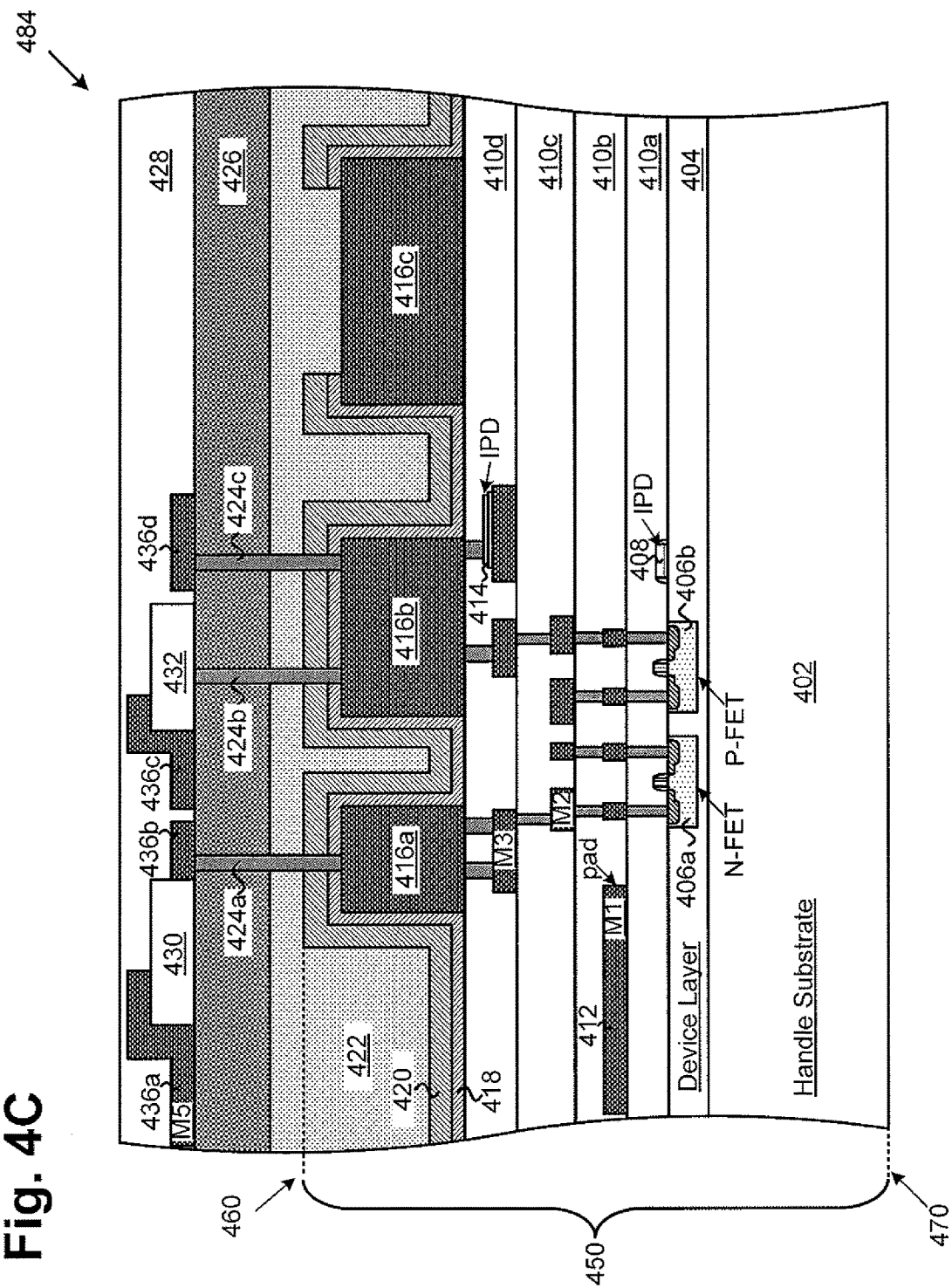
FIG. 4C illustrates a cross-sectional view of a portion of an exemplary structure for integration of at least one thermally conductive but electrically isolating layer with a semiconductor wafer processed in accordance with an intermediate action in the flowchart of FIG. 3 according to one implementation of the present application.

Referring to action 384 in FIG. 3 and structure 484 in FIG. 4C, action 384 includes forming a second device layer over the first thermally conductive but electrically isolating layer, the second device layer being coupled to the first device layer. Referring to FIG. 4C, structure 484 illustrates a cross-sectional view of a portion of an exemplary structure for integration of at least one thermally conductive but electrically isolating layer with a semiconductor wafer after the processing of action 384 in flowchart 300 of FIG. 3, according to one implementation of the present application. As illustrated in FIG. 4C, structure 484 includes second device layer 428 over first thermally conductive but electrically isolating layer 426.

In the present implementation, second device layer 428 includes dielectric material, such as an oxide-based material. As illustrated in FIG. 4C, passive devices 430 and 432 are formed in second device layer 428 over first thermally conductive but electrically isolating layer 426. Passive devices 430 and 432 may each include a resistor, a capacitor, an inductor, a coupler, a transformer, an antenna, a microelectromechanical systems (MEMS) device, or a phase change device (e.g., a phase change memory device or a phase change RF device, such as a switch).

As illustrated in FIG. 4C, passive device 430 in second device layer 428 is electrically coupled to NFET 406*a* in first device layer 404 through contact pad 436*b*, conductive via 424*a*, contact pad 416*a*, and various other conductive vias and patterned interconnect metal layers in semiconductor metal 450. In one implementation, NFET 406*a* may be a part of an integrated circuit controlling (e.g., driving) the operation of passive device 430. As illustrated in FIG. 4C, contact pad 436*a* is also coupled to passive device 430 for external connection, for example. Similarly, passive device 432 in second device layer 428 is coupled to PFET 406*b* in first device layer 404 through conductive via 424*b*, contact pad 416*b*, and various other conductive vias and patterned interconnect metal layers in semiconductor metal 450. In one implementation, PFET 406*b* may be a part of an integrated circuit controlling (e.g., driving) the operation of passive device 432. As illustrated in FIG. 4C, contact pad 436*c* is coupled to passive device 432 for external connection, for example. Contact pad 436*d* is coupled to conductive via 424*c* for external connection, for example. Contact pads 436*a*, 436*b*, 436*c* and 436*d* may be formed by any suitable method, and may include any suitable conductive material, such as a metal or a metal alloy.

Figure 4D:
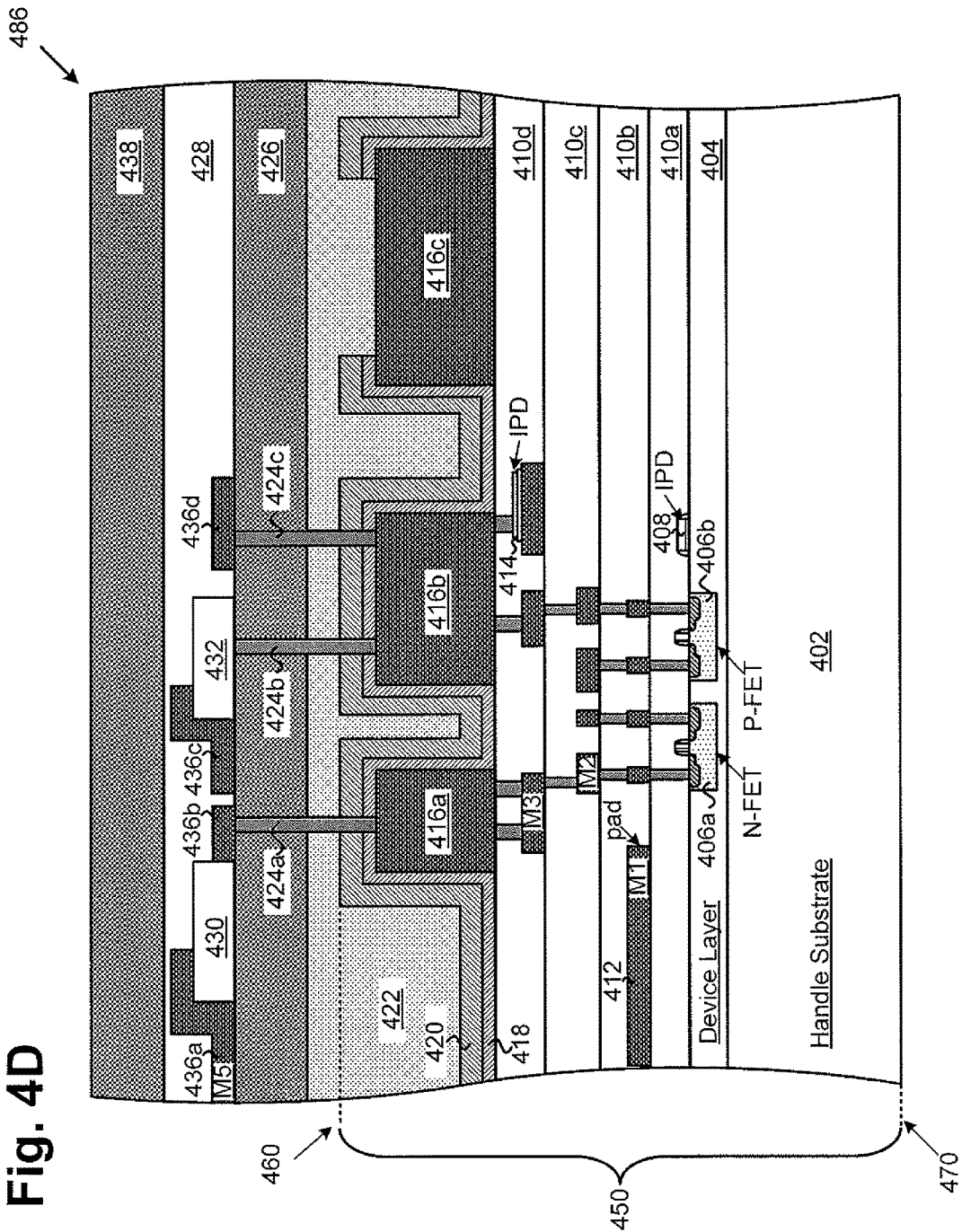
FIG. 4D illustrates a cross-sectional view of a portion of an exemplary structure for integration of at least one thermally conductive but electrically isolating layer with a semiconductor wafer processed in accordance with an intermediate action in the flowchart of FIG. 3 according to one implementation of the present application.

Referring to action 386 in FIG. 3 and structure 486 in FIG. 4D, action 386 includes forming a second thermally conductive but electrically isolating layer over the second device layer. Referring to FIG. 4D, structure 486 illustrates a cross-sectional view of a portion of an exemplary structure for integration of at least one thermally conductive but electrically isolating layer with a semiconductor wafer after the processing of action 386 in flowchart 300 of FIG. 3, according to one implementation of the present application. As illustrated in FIG. 4D, structure 486 includes second thermally conductive but electrically isolating layer 438 over second device layer 428 on front side 460 of semiconductor wafer 450.

As illustrated in FIG. 4D, second thermally conductive but electrically isolating layer 438 is situated over second device layer 428 on front side 460 of semiconductor wafer 450. In one implementation, second thermally conductive but electrically isolating layer 438 may have substantially the same composition as first thermally conductive but electrically isolating layer 426. In another implementation, second thermally conductive but electrically isolating layer 438 may have a different composition from first thermally conductive but electrically isolating layer 426.

In the present implementation, second thermally conductive but electrically isolating layer 438 has a high thermal conductivity, it is configured to draw heat away from semiconductor wafer 450 not only in a direction perpendicular to front side 460 of semiconductor wafer 450, but more importantly in directions parallel to front side 460 of semiconductor wafer 450. In addition, second thermally conductive but electrically isolating layer 438 is configured to draw heat away from passive devices 430 and 432 in second device layer 428. Since heat generated by devices, such as passive devices 430 and 432, can be effectively drawn out of second device layer 428 through second thermally conductive but electrically isolating layer 438, the devices integrated in second device layer 428 can be fabricated much closer to one another, at cell pitches less than the conventionally predetermined minimum cell pitch for preventing overheating. Thus, second device layer 428 on semiconductor wafer 450 can have an increased cell density. Second thermally conductive but electrically isolating layer 438 is also configured to draw heat out of semiconductor devices, such as NFET 406*a* and PFET 406*b*, in first device layer 404. Since heat generated by semiconductor devices, such as NFET 406*a* and PFET 406*b* can be drawn out of semiconductor wafer 450 through first thermally conductive but electrically isolating layer 426 and second thermally conductive but electrically isolating layer 438, the semiconductor devices integrated in first device layer 404 can be fabricated much closer to one another, at cell pitches less than the conventionally predetermined minimum cell pitch to prevent overheating. Thus, semiconductor wafer 450 can have an increased cell density, which can in turn lead to better device performance characteristics, such as a higher current carrying capability and lower $R_{DSON}$.

Referring to action 388 in FIG. 3 and structure 488 in FIG. 4E, action 388 includes forming at least one front side pad opening on the front side of the semiconductor wafer. Referring to FIG. 4E, structure 488 illustrates a cross-sectional view of a portion of an exemplary structure for integration of at lease one thermally conductive but electrically isolating layer with a semiconductor wafer after the processing of action 388 in flowchart 300 of FIG. 3, according to one implementation of the present application. As illustrated in FIG. 4E, structure 488 includes front side pad openings 440*a*, 440*b*, 440*c*, 440*d* and 440*e* on front side 460 of semiconductor wafer 450.

As illustrated in FIG. 4E, front side pad openings 440*a*, 440*b*, 440*c* and 440*d* each extend through second thermally conductive but electrically isolating layer 438 and second device layer 428 from front side 460 of semiconductor wafer 450, and reach contact pads 436*a*, 436*b*, 436*c* and 436*d*, respectively. Front side pad openings 440*a*, 440*b*, 440*c*, and 440*d* allow external connections to contact pads 436*a*, 436*b*, 436*c* and 436*d*, respectively. In addition, front side pad opening 440*e* extends through second thermally conductive but electrically isolating layer 438, second device layer 428, first thermally conductive but electrically isolating layer 426, and oxide layer 422 from front side 460 of semiconductor wafer 450, and reaches contact pad 416*c*. Front side pad opening 440*e* allows external connection to contact pad 416c. Front side pad openings 440a, 440b, 440c, 440d and 440e may be formed by any suitable method, such as a patterned etch. It should be understood that, other front side pad openings can be formed on front side 460 of semiconductor wafer 450 to reach other contact pads (not explicitly shown in FIG. 4E) in semiconductor wafer 450.

In one implementation, semiconductor structure 488 can be flip-chip mounted, with front side 460 of semiconductor wafer 450 facing down, to a printed circuit board (not explicitly shown in FIG. 4E) through conductive adhesives. In another implementation, handle substrate 402 of semiconductor structure 488 can be attached to a printed circuit board (not explicitly shown in FIG. 4E), where contact pads 436a, 436b, 436c, 436d and 416c can make electrical connections with the printed circuit board through wire bonds.

Figure 5:
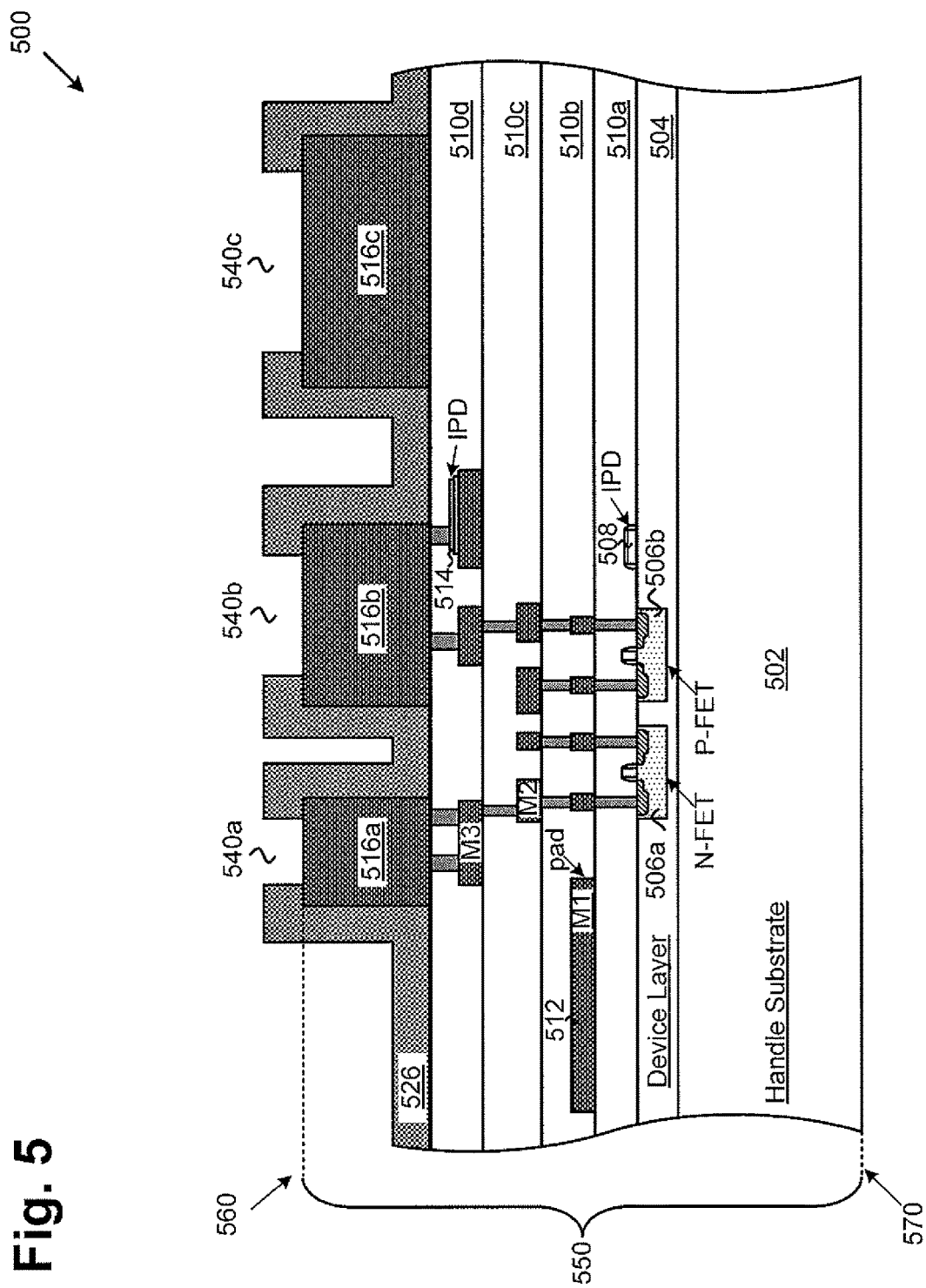
FIG. 5 illustrates a cross-sectional view of a portion of an exemplary structure for integration of a thermally conductive but electrically isolating layer with a semiconductor wafer according to one implementation of the present application.

Referring to FIG. 5, structure 500 illustrates a cross-sectional view of a portion of an exemplary structure for integration of a thermally conductive but electrically isolating layer with a semiconductor wafer according to one implementation of the present application. As illustrated in FIG. 5, structure 500 includes patterned thermally conductive but electrically isolating layer 526 with front side pad openings 540a, 540b and 540c on front side 560 of semiconductor wafer 550. With similar numerals representing similar features in FIG. 4E, semiconductor wafer 550 includes handle substrate 502, first device layer 504, dielectric layers 510a, 510b, 510c and 510d, and contact pads 516a, 516b and 516c. In the present implementation, semiconductor wafer 550 is a radio frequency (RF) complementary metal-oxide-semiconductor (CMOS) wafer. In other implementations, semiconductor wafer 550 may be any suitable semiconductor wafer.

As illustrated in FIG. 5, handle substrate 502 is on back side 570 of semiconductor wafer 550. Handle substrate 502 can include any suitable material to support active and/or passive devices thereon. In one implementation, handle substrate 502 may be a semiconductor substrate, having silicon, silicon-on-insulator (SOI), silicon-on-sapphire (SOS), silicon germanium, an epitaxial layer of silicon formed on a silicon substrate, or the like. In another implementation, handle substrate 502 may be a high resistivity substrate.

As illustrated in FIG. 5, first device layer 504 is on handle substrate 502. First device layer 504 can include any suitable semiconductor material having silicon, silicon germanium or the like. In the present implementation, first device layer 504 may include active circuits that can comprise any form of circuitry that switches from one state to another to perform logic functions (e.g., transistors) such as radio frequency (RF) circuits, power amplifier circuits, voltage control oscillator circuits, ring oscillator circuits, low noise amplifier circuits, mixer circuits, digital-to-analog converter circuits, and analog-to-digital converters circuits. As illustrated in FIG. 5, first device layer 504 includes N-channel field-effect transistor (NFET) 506a and P-channel field-effect transistor (PFET) 506b integrated therein. NFET 506a may be formed in a CMOS P well, and include source and drain regions and a gate structure formed over a channel region of NFET 506a. PFET 506b may be formed in a CMOS N well, and include source and drain regions and a gate structure formed over a channel region of PFET 506b. It should be noted that, although only NFET 506a and PFET 506b are shown in FIG. 5, there can be other active devices, such as BiCMOS devices and/or power amplifiers, integrated in first device layer 504. As illustrated in FIG. 5, integrated passive device 508 is formed on first device layer 504. Integrated passive device 508 may include a resistor, a capacitor, an inductor, a coupler, a transformer, an antenna, a microelectromechanical systems (MEMS) device, or a phase change device (e.g., a phase change memory device or a phase change RF device, such as a switch). It should be noted that, although only integrated passive device 508 is shown in FIG. 5, there can be other integrated passive devices on first device layer 504.

As illustrated in FIG. 5, dielectric layers 510a, 510b, 510c and 510d are formed over first device layer 504. Dielectric layers 510a, 510b, 510c and 510d may include any suitable dielectric material, such as silicon dioxide. Interconnect metal layers M1, M2 and M3 are formed and patterned on dielectric layers 510a, 510b and 510c, respectively. As illustrated in FIG. 5, patterned interconnect metal layers along with conductive vias are configured to provide electrical connections to one or more devices, such as NFET 506a and PFET 506b. In addition, contact pad 512 as a part of patterned interconnect metal layer M1 is formed on dielectric layer 510a, and configured to provide electrical connection for one or more devices integrated in semiconductor wafer 550.

As illustrated in FIG. 5, NFET 506a is electrically coupled to contact pad 516a situated over dielectric layer 510d through corresponding patterned interconnect metal layers M1, M2 and M3, and conductive vias. Similarly, PFET 506b is electrically coupled to contact pad 516b situated over dielectric layer 510d through corresponding patterned interconnect metal layers M1, M2 and M3, and conductive vias. Also, integrated passive device 514 is formed on dielectric layer 510c and coupled to contact pad 516b through one or more conductive vias, for example. Integrated passive device 514 may include a passive device such as a resistor, a capacitor, an inductor, a coupler, a transformer, an antenna, a microelectromechanical systems (MEMS) device, or a phase change device (e.g., a phase change memory device or a phase change RF device, such as a switch). Contact pad 516c is situated over dielectric layer 510d, and electrically coupled to one or more semiconductor devices (not explicitly shown in FIG. 5) integrated in semiconductor wafer 550. Patterned interconnect metal layers M1, M2 and M3, conductive vias, and contact pads 516a, 516b and 516c may each include any suitable conductive material, such as a metal or a metal alloy.

As illustrated in FIG. 5, front side 560 of semiconductor wafer 550 is covered with patterned thermally conductive but electrically isolating layer 526 having front side pad openings 540a, 540b and 540c exposing contact pads 516a, 516b and 516c, respectively. In the present implementation, patterned thermally conductive but electrically isolating layer 526 includes a material with a high thermal conductivity (e.g., at least 36 W/mK) and a high resistivity (e.g., at least $10^{14}$ ohm-cm). In addition, patterned thermally conductive but electrically isolating layer 526 has a coefficient of thermal expansion (CTE) that is closely matched (e.g., within the same order of magnitude) with the effective CTE of semiconductor wafer 550 to reduce mechanical and thermal stresses. In the present implementation, patterned thermally conductive but electrically isolating layer 526 includes aluminum nitride (AlN). For example, aluminum nitride has a high thermal conductivity in a range approximately between 170-200 W/mK, a high resistivity of at least $10^{14}$ ohm-cm, and a CTE of approximately 4.6 ppm/C which is closely matched with the effective CTE of semiconductor wafer 550 (e.g., silicon around 2.3-3.6 ppm/C). In another implementation, patterned thermally conductive but electrically isolating layer 526 may include beryllium oxide having a high thermal conductivity of approximately 260 W/mK, a high resistivity of at least 10^14 ohm-cm, and a CTE of approximately 8.5 ppm/C which is closely matched with the effective CTE of semiconductor wafer 550. In yet another implementation, patterned thermally conductive but electrically isolating layer 526 may include aluminum oxide having a high thermal conductivity of approximately 36 W/mK, a high resistivity of at least 10^94 ohm-cm, and a CTE of approximately 8.2 ppm/C which is closely matched with the effective CTE of semiconductor wafer 550.

In one implementation, patterned thermally conductive but electrically isolating layer 526 can be formed by any appropriate deposition technique, such as chemical vapor deposition (CVD), physical vapor deposition (PVD) or atomic layer deposition (ALD) for example. In one implementation, patterned thermally conductive but electrically isolating layer 526 may have a thickness in a range approximately between 0.5-2 microns (i.e., 10^−6 meters). In one implementation, patterned thermally conductive but electrically isolating layer 526 is formed preferably at low temperate (e.g., less than 450° C.) to prevent damage to semiconductor devices and interconnect metal layers in semiconductor wafer 550. It should be noted that the thermal conductivity, the resistivity, the CTE and the thickness of patterned thermally conductive but electrically isolating layer 526 are not limited by the specified values or ranges mentioned above.

In the present implementation, since patterned thermally conductive but electrically isolating layer 526 has a high thermal conductivity, it is configured to dissipate heat from semiconductor devices integrated in semiconductor wafer 550. For example, patterned thermally conductive but electrically isolating layer 526 is thermally coupled to semiconductor devices, such as NFET 506a and NFET 506b, integrated in first device layer 504. Patterned thermally conductive but electrically isolating layer 526 is configured to draw heat away from semiconductor wafer 550 not only in a direction perpendicular to front side 560 of semiconductor wafer 550, but more importantly in directions parallel to front side 560 of semiconductor wafer 550. Since heat generated by semiconductor devices, such as NFET 506a and PFET 506b, can be effectively drawn out of semiconductor wafer 550 through patterned thermally conductive but electrically isolating layer 526, the semiconductor devices integrated in first device layer 504 can be fabricated much closer to one another, at cell pitches less than the conventionally predetermined minimum cell pitch for preventing overheating. Thus, semiconductor wafer 550 can have an increased cell density, which can in turn lead to better device performance characteristics, such as a higher current carrying capability and lower $R_{DSON}$.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A semiconductor structure comprising:
 a semiconductor wafer having at least one semiconductor device integrated in a first device layer;
 a thermally conductive but electrically isolating layer on a front side of said semiconductor wafer, said thermally conductive but electrically isolating layer between said first device layer and a second device layer;
 at least one passive device situated on said thermally conductive but electrically isolating layer and in said second device layer;
 wherein said thermally conductive but electrically isolating layer is configured to dissipate heat from said at least one semiconductor device integrated in said first device layer.

2. The semiconductor structure of claim 1 wherein said thermally conductive but electrically isolating layer is selected from the group consisting of aluminum nitride, beryllium oxide, and aluminum oxide.

3. The semiconductor structure of claim 1 wherein said first device layer comprises at least one active device and said second device layer comprises said at least one passive device.

4. The semiconductor structure of claim 3 wherein said at least one passive device is coupled to said at least one active device.

5. The semiconductor structure of claim 1 wherein said first device layer is situated over a handle substrate.

6. The semiconductor structure of claim 1 further comprising another thermally conductive but electrically isolating layer over said second device layer.

7. The semiconductor structure of claim 1 further comprising at least one pad opening extending from said front side of said semiconductor wafer to a contact pad.

8. A semiconductor structure comprising:
 a semiconductor wafer having at least one semiconductor device integrated in a first device layer;
 a patterned thermally conductive but electrically isolating layer on a front side of said semiconductor wafer;
 a contact pad on said front side of said semiconductor wafer connected to said patterned thermally conductive but electrically isolating layer, said contact pad electrically coupled to said at least one semiconductor device;
 wherein said patterned thermally conductive but electrically isolating layer is configured to dissipate heat from said at least one semiconductor device integrated in said first device layer.

9. The semiconductor structure of claim 8 wherein said thermally conductive but electrically isolating layer is selected from the group consisting of aluminum nitride, beryllium oxide, and aluminum oxide.

10. The semiconductor structure of claim 8 wherein said first device layer comprises at least one active device.

11. The semiconductor structure of claim 10 wherein said at least one active device is selected from the group consisting of a complementary-metal-oxide-semiconductor (CMOS) switch and a bipolar complementary-metal-oxide-semiconductor (BiCMOS) switch.

12. The semiconductor structure of claim 8 wherein said first device layer is situated over a handle substrate.

13. The semiconductor structure of claim 12 wherein said handle substrate comprises a silicon-on-insulator substrate.

14. The semiconductor structure of claim 8 wherein said patterned thermally conductive but electrically isolating layer comprises at least one pad opening exposing said contact pad.

15. A semiconductor structure comprising:
- a semiconductor wafer having at least one semiconductor device integrated in a first device layer;
- a patterned thermally conductive but electrically isolating layer on a front side of said semiconductor wafer, said patterned thermally conductive but electrically isolating layer between said first device layer and a second device layer;
- at least one passive device situated on said patterned thermally conductive but electrically isolating layer and in said second device layer;
- wherein said patterned thermally conductive but electrically isolating layer is configured to dissipate heat from said semiconductor structure.

16. The semiconductor structure of claim 15 wherein said patterned thermally conductive but electrically isolating layer is selected from the group consisting of aluminum nitride, beryllium oxide, and aluminum oxide.

17. The semiconductor structure of claim 15 wherein said first device layer comprises at least one active device and said second device layer comprises said at least one passive device.

18. The semiconductor structure of claim 17 wherein said at least one passive device is coupled to said at least one active device.

19. The semiconductor structure of claim 15 wherein said first device layer is situated over a handle substrate.

20. The semiconductor structure of claim 15 wherein said patterned thermally conductive but electrically isolating layer comprises at least one pad opening exposing a contact pad.

* * * * *